(12) United States Patent
Kondo et al.

(10) Patent No.: US 9,666,761 B2
(45) Date of Patent: May 30, 2017

(54) LIGHT-EMITTING DEVICE

(71) Applicant: KABUSHIKI KAISHA TOSHIBA, Tokyo (JP)

(72) Inventors: Katsufumi Kondo, Nanoichi Ishikawa (JP); Kenji Fujimoto, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,000

(22) Filed: Mar. 4, 2016

(65) Prior Publication Data

US 2017/0077352 A1  Mar. 16, 2017

(30) Foreign Application Priority Data

Sep. 10, 2015  (JP) ................................. 2015-178373

(51) Int. Cl.
*H01L 33/14* (2010.01)
*H01L 33/38* (2010.01)
(Continued)

(52) U.S. Cl.
CPC .............. *H01L 33/38* (2013.01); *H01L 33/14* (2013.01); *H01L 33/22* (2013.01); *H01L 33/24* (2013.01); *H01L 33/30* (2013.01); *H01L 33/405* (2013.01); *H01L 33/54* (2013.01); *H01L 33/56* (2013.01); *H01L 33/58* (2013.01); *H01L 33/62* (2013.01)

(58) Field of Classification Search
CPC ....................................................... H01L 33/38
See application file for complete search history.

(56) References Cited

U.S. PATENT DOCUMENTS 6,458,612 B1 * 10/2002 Chen ................... H01L 33/0079
  438/29
6,762,070 B2 * 7/2004 Kaneyama ............. B82Y 20/00
  257/79
(Continued)

FOREIGN PATENT DOCUMENTS

JP  2003008080 A  1/2003
JP  4065655 B2  3/2008
(Continued)

OTHER PUBLICATIONS

Taiwan Office Action dated Aug. 17, 2016, filed in Taiwan counterpart Application No. 105106576, 8 pages (with translation).

*Primary Examiner* — Eugene Lee
(74) *Attorney, Agent, or Firm* — Patterson & Sheridan, LLP (57) ABSTRACT

A light-emitting device includes a substrate that is capable of transmitting light, a conductive layer that includes a first conductive portion provided on the substrate and a second conductive portion which is provided on the substrate so as to be adjacent to the first conductive portion, The second conductive portion is thinner than the first conductive portion. A light emitting layer is provided on the first conductive portion. A first electrode is provided on the second conductive portion. A second electrode is provided on the light emitting layer. In some embodiments, a backside surface of the substrate may be processed to be optically rough so as to limit internal reflections.

18 Claims, 9 Drawing Sheets

(51) Int. Cl.
*H01L 33/62* (2010.01)
*H01L 33/22* (2010.01)
*H01L 33/24* (2010.01)
*H01L 33/54* (2010.01)
*H01L 33/56* (2010.01)
*H01L 33/58* (2010.01)
*H01L 33/30* (2010.01)
*H01L 33/40* (2010.01)

(56) References Cited

U.S. PATENT DOCUMENTS

| | | | | |
|---|---|---|---|---|
| 7,109,529 | B2* | 9/2006 | Uemura | H01L 33/405 257/11 |
| 7,960,749 | B2* | 6/2011 | Lin | H01L 33/20 257/428 |
| 8,288,787 | B2* | 10/2012 | Yoo | H01L 33/44 257/98 |
| 8,754,429 | B2 | 6/2014 | Koizumi et al. | |
| 9,368,684 | B2* | 6/2016 | Kang | H01L 33/02 |
| 2002/0024055 | A1* | 2/2002 | Uemura | H01L 33/46 257/98 |
| 2003/0132447 | A1* | 7/2003 | Yukimoto | H01L 27/153 257/88 |
| 2009/0159902 | A1* | 6/2009 | Yasuda | H01L 33/08 257/88 |
| 2011/0291141 | A1* | 12/2011 | Sorimachi | H01L 33/405 257/98 |
| 2011/0291148 | A1* | 12/2011 | Sugizaki | H01L 33/44 257/99 |
| 2011/0297983 | A1* | 12/2011 | Nishiuchi | H01L 33/647 257/98 |
| 2014/0091352 | A1* | 4/2014 | Feng | H01L 33/42 257/99 |
| 2015/0014721 | A1 | 1/2015 | Liao et al. | |

FOREIGN PATENT DOCUMENTS

| | | |
|---|---|---|
| JP | 2008159628 A | 7/2008 |
| JP | 2014116439 A | 6/2014 |
| TW | 201135971 A | 10/2011 |
| TW | 201503409 A | 1/2015 |

* cited by examiner

LIGHT-EMITTING DEVICE

CROSS-REFERENCE TO RELATED APPLICATION

This application is based upon and claims the benefit of priority from Japanese Patent Application No. 2015-178373, filed Sep. 10, 2015, the entire contents of which are incorporated herein by reference.

FIELD

Embodiments described herein relate generally to a light-emitting device.

BACKGROUND

Back-side emission-type light emitting diodes are known. In such a device, an anode electrode or a cathode electrode are provided on the surface of a substrate that is capable of transmitting light, and the other of the anode electrode or the cathode electrode is provided on a surface of the light emitting layer stack.

In the back-side emission-type light emitting diode, a substrate generally serves as a current path. For this reason, the carrier concentration of the substrate may have influence on electrical characteristics of the device. In order to suppress this possible influence, a method of forming a conductive layer (to serve as a current path) on the surface of the substrate is adopted. However, light emitted from the rear surface of the substrate in such a device includes light rays having different emission areas along the substrate. One of the light ray emission area emits primarily direct light emitted from the lower side of the light emitting layer. The other light ray emission area emits indirect light reflected from the lower side of an electrode disposed on the substrate. This indirect light may be reflected by the rear surface of the substrate and is then further reflected by the electrode provided on the substrate. The indirect light also includes another indirect light which is initially emitted upward from the light emitting layer, then reflected downwardly by an electrode on the light emitting layer. This indirect reflected passes through the light emitting layer and is emitted from the lower side of the light emitting layer.

When a conductive layer is formed on the substrate, a portion of emitted light is absorbed into the conductive layer, especially indirect light which would be reflected at the rear surface of the substrate toward the electrode provided on the substrate. For this reason, the amount of emitted indirect light is greatly decreased, as compared to the amount of direct light. As a result, there may be a problem in that a large amount of light is unevenly distributed on the lower side of the light emitting layer, and a small amount of light is unevenly distributed on the lower side of the electrode provided on the substrate.

DETAILED DESCRIPTION

An example embodiment provides a light-emitting device having a more even distribution of emitted light.

In general, according to one embodiment, a light-emitting device includes a transparent substrate having a first surface, a conductive layer including a first conductive portion on the first surface and a second conductive portion on the first surface and adjacent to the first conductive portion, the second conductive portion having a thickness from the first surface that is less than a thickness of the first conductive portion from the first surface, a light emitting layer on the first conductive portion, a first electrode on the second conductive portion, and a second electrode on the light emitting layer.

Hereinafter, rear emission-type light emitting diodes according to various embodiments will be described with reference to the accompanying drawings. The scope of the present disclosure is not limited to these exemplary embodiments.

(First Embodiment)

Figure 1A:
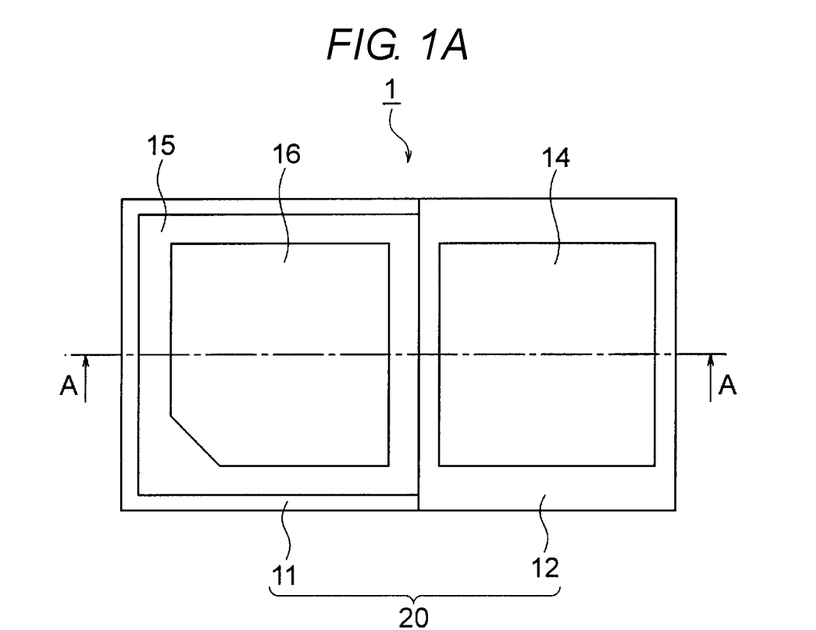
FIG. 1A is a plan view illustrating a schematic configuration of a light-emitting device according to a first embodiment.
Figure 1B:
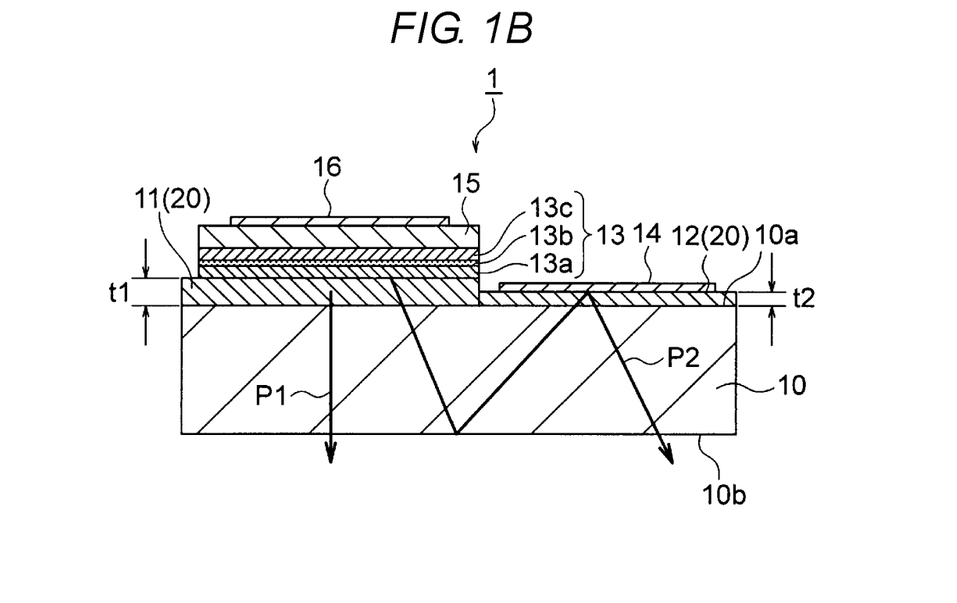
FIG. 1B is a cross-sectional view taken along line A-A illustrated in FIG. 1A.

FIG. 1A is a plan view illustrating a schematic configuration of a light-emitting device according to a first embodiment, and FIG. 1B is a cross-sectional view taken along line A-A illustrated in FIG. 1A. As illustrated in FIGS. 1A and 1B, a light-emitting device 1 according to the first embodiment includes a substrate 10, a conductive layer 20, a light emitting layer 13, a first electrode 14, a current diffusion layer 15, and a second electrode 16.

The substrate 10 comprises a substrate material, such as a gallium phosphide (GaP), which is capable of transmitting light. The substrate 10 includes a first surface 10a and a second surface 10b that faces the first surface 10a. A conductive layer 20 is provided on the first surface 10a. The second surface 10b is a light emission surface for the light-emitting device 1. Here, due to the inclusion of conductive layer 20, the substrate 10 is not limited to a conductive substrate material, and may be an insulating substrate, such as a sapphire substrate, on which conductive layer 20 is disposed.

The conductive layer 20 includes a first conductive portion 11 and a second conductive portion 12. The first conductive portion 11 and the second conductive portion 12, which are epitaxial growth layers, are provided on the substrate 10 so as to be adjacent to each other. In addition, as illustrated in FIG. 1B, a thickness t2 of the second conductive portion 12 is smaller than a thickness t1 of the first conductive portion 11. In the first embodiment, the first conductive portion 11 and the second conductive portion 12 are configured as separate, distinct bodies, but the first conductive portion 11 and the second conductive portion 12 may also be integrally formed (connected). In addition, the conductive layer 20 may be a conductive semiconductor layer, such as indium tin oxide (ITO), or a thin metal film, or may be a combination thereof.

The light emitting layer 13 is provided on the first conductive portion 11. In the first embodiment, the light emitting layer 13 includes a P-type or N-type first clad layer 13a, an active layer 13b, and an N-type or P-type second clad layer 13c. The first clad layer 13a is provided on the first conductive portion 11. The active layer 13b is provided on the first clad layer 13a. The second clad layer 13c is provided on the active layer 13b. In other words, the active layer 13b is interposed between the first clad layer 13a and the second clad layer 13c.

The first clad layer 13a and the second clad layer 13c are formed of a material having a band gap wider than that of the active layer 13b, for example, aluminum gallium indium phosphide (InGaAlP) or gallium aluminum arsenide (GaAlAs).

The active layer 13b is a semiconductor layer such as indium gallium arsenide (InGaAs), GaAlAs, or gallium arsenide (GaAs). When holes or electrons are injected into the active layer 13b from the first clad layer 13a and electrons or holes are injected into the active layer 13b from the second clad layer 13c as carriers, the active layer 13b emits, for example, infrared light. However, the light of the light emitting layer 13 is not limited to infrared light, and may be light in another wavelength range.

The first electrode 14 is provided on the second conductive portion 12. In the first embodiment, the first electrode 14 is an anode electrode.

The current diffusion layer 15 is provided on the light emitting layer 13. The current diffusion layer 15 is formed of, for example, InAlGaP or AlGaAs. A current is more uniformly supplied to the entire light emitting layer 13 by incorporation of the current diffusion layer 15.

In addition, a thin contact layer (not specifically shown) formed of GaAs or the like or a material (AlGaAs, GaP, or the like) can be included between the current diffusion layer 15 and the second electrode 16 in order to achieve satisfactory ohmic contact between these elements.

The second electrode 16 is provided on the current diffusion layer 15. In the first embodiment, the second electrode 16 is a cathode electrode. However, when the polarities (P-type and N-type) of the conductive layers 20 are opposite to each other, the first electrode 14 is equivalent to a cathode electrode, and the second electrode 16 is equivalent to an anode electrode.

In some embodiments, the second electrode 16 may be provided on the upper surface of the light emitting layer 13 without the interposition of current diffusion layer 15. In other words, in this disclosure, the wording "a second electrode 16 provided on the light emitting layer 13" includes both a configuration in which the second electrode 16 is indirectly provided on the light emitting layer 13 via the current diffusion layer 15 and a configuration in which the second electrode 15 is directly provided on the light emitting layer 13 (without a current diffusion layer 15).

In addition, when the light-emitting device 1 is used, for example, in a photocoupler together with a light-receiving element, a bonding wire (not shown) may be bonded to each of the first electrode 14 and the second electrode 16. In addition, the light-emitting device 1 is typically covered, encapsulated with a resin material (not shown).

In the light-emitting device 1 configured as described above, when a current flows between the first electrode 14 and the second electrode 16, the light emitting layer 13 emits light. A first light P1 and a second light P2 are emitted from the second surface 10b. The first light P1 is substantially direct light emitted downwardly from the lower side of the light emitting layer 13. The second light P2 is indirect light which is first internally reflected at the second surface 10b, and then further reflected by the underside surface of the first electrode 14, and subsequently emitted through a portion of the substrate 10 below the first electrode 14.

According to the above-described first embodiment, the second conductive portion 12 is provided on the substrate 10. Here, effects obtained by the second conductive portion 12 will be described with reference to FIG. 2.

Figure 2:
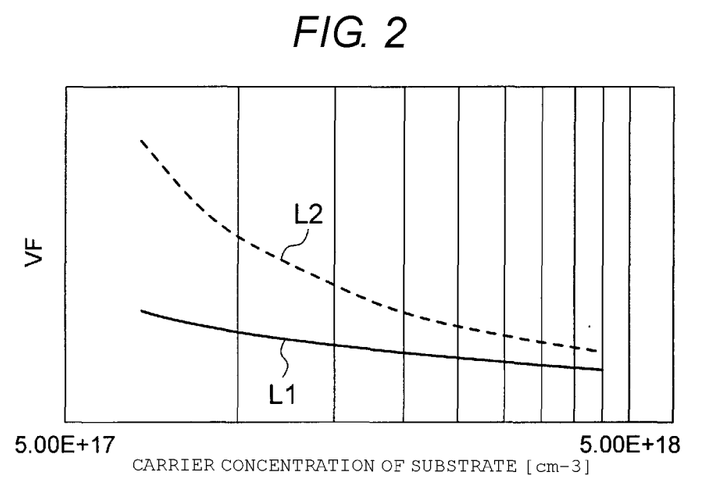
FIG. 2 is a graph illustrating a relationship between a carrier concentration of a substrate and electrical characteristics of a light-emitting device.

FIG. 2 is a graph illustrating a relationship between a carrier concentration of a substrate and electrical characteristics of a light-emitting device. In FIG. 2, a horizontal axis represents a carrier concentration of the substrate 10. A vertical axis represents a forward voltage VF (arbitrary units) which is one of electrical characteristics of the light-emitting device 1. In addition, a relatively straight line L1 indicates a characteristic of the light-emitting device 1 according to the first embodiment. A dotted line L2 indicates a characteristic of a light-emitting device according to a comparative example lacking a second conductive portion 12, but otherwise similar to light-emitting device 1.

As noted, the light-emitting device according to the comparative example is not provided with the second conductive portion 12. In other words, in the light-emitting device according to the comparative example, the first electrode 14 comes into direct contact with the substrate 10, and thus the substrate 10 must serve as a current path. For this reason, as indicated by the dotted line L2 of FIG. 2, in the light-emitting device, the forward voltage VF tends to be more strongly influenced by the carrier concentration of the substrate 10.

On the other hand, according to the light-emitting device 1 according to the first embodiment, the second conductive portion 12 is provided on the substrate 10, and the first electrode 14 is provided on the second conductive portion 12 rather than directly on the substrate 10. Thereby, the second conductive portion 12 and the first conductive portion 11 serve as current paths. For this reason, as indicated by the relatively straight line L1 of FIG. 2, in the light-emitting device 1 according to the first embodiment, the forward voltage VF is not likely to be significantly influenced by the carrier concentration variations in the substrate 10. In the first embodiment, it is generally preferable that a difference in carrier concentrations of the substrate 10 and the conductive layer 20 be provided and that the carrier concentration of the conductive layer 20 be higher than that of the substrate 10. In addition, it is also preferable that a high-concentration region is located on the substrate side of the conductive layer 20. Furthermore, the carrier concentration of this high-concentration region is preferably equal to or higher than 1E18/cm$^3$, and more preferably, equal to or higher than 3E18/cm$^3$.

Further, as illustrated in FIG. 1B, according to the first embodiment, the thickness t2 of the second conductive portion 12 is smaller than the thickness t1 of the first conductive portion 11. For this reason, the light absorptivity of the second conductive portion 12 becomes lower than the light absorptivity of the first conductive portion 11. Thereby, when light internally reflected by the second surface 10b is further reflected by the first electrode 14, the amount of light absorbed is decreased as compared to the first conductive portion 11. As a result, a difference between the amount of first light P and the amount of second light P2 is reduced. In other words, a difference between the amount of light emitted to the lower side of the light emitting layer 13 and the amount of light emitted to the lower side of the first electrode 14 is reduced. Accordingly, it is possible to suppress the uneven distribution of the amount of light.

When the light-emitting device 1 according to the present embodiment is used in a photocoupler, the bottom face of the substrate 10 is bonded to a light-receiving element using a mounting material (not specifically depicted). In this case, to suppress the uneven distribution of the amounts of first light P1 and second light P2, it is preferable that a difference in refractive index between the substrate 10 and the mounting material is large, in other words, the substrate 10 and the mounting material having a high reflectivity (large total reflection angle) are combined with each other. Specifically, it is preferable to use a mounting material having a difference in refractive index of equal to or higher than 0.5 with respect to a substrate (e.g., GaP or the like) having a refractive index of equal to or higher than 3 or the substrate 10 which is formed of a material, such as ZnO, having a refractive index of equal to or higher than 2. A mounting material (e.g., an adhesive) having a low refractive index includes epoxy resins, silicone resins, or the like.

Modification Example 1

Figure 3:
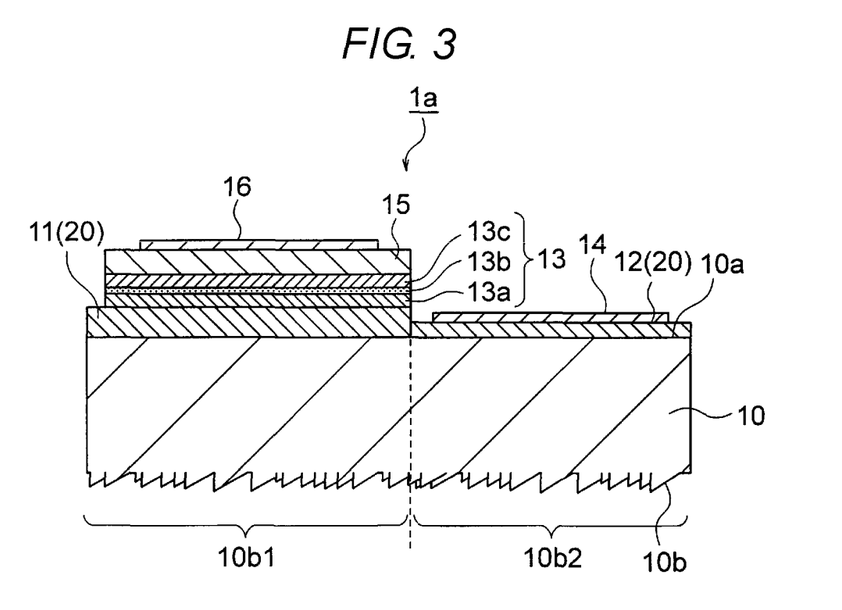
FIG. 3 is a cross-sectional view illustrating a schematic configuration of a light-emitting device according to a modification example of the first embodiment.

Hereinafter, a modification example of the first embodiment will be described with reference to FIG. 3. FIG. 3 is a cross-sectional view illustrating a schematic configuration of a light-emitting device according to a modification example of the first embodiment.

As illustrated in FIG. 3, in a light-emitting device 1a, a second surface 10b of a substrate 10 has a textured structure which results from being subjected to unevenness processing. For this reason, it is possible to diffuse/scatter light emitted from the second surface 10b over a wider range.

Meanwhile, in the present modification example, the surface roughness of a region 10b1 may be greater than the surface roughness of a region 10b2 in the second surface 10b. Here, the region 10b1 is a region corresponding to the first conductive portion 11, and the region 10b2 is a region corresponding to the second conductive portion 12. In this context, the surface roughness of each region can be specified by, for example, an average value of differences in the height of irregularities per unit area.

Also in the light-emitting device 1a, first light P1 and second light P2 are emitted from the second surface 10b of the substrate 10. However, the second light P2 is reflected by the second surface 10b and a first electrode 14. For this reason, the optical loss of the second light P2 is larger than the optical loss of the first light P1.

Consequently, when the surface roughness of the region 10b1 is larger than the surface roughness of the region 10b2, the amount of light reflected by the second surface 10b is increased. As a result, the amount of second light P2 is increased. Thereby, a difference between the amount of first light P1 and the amount of second light P2 is further reduced, and thus more uniform light can emit from the second surface 10b of the substrate 10.

(Second Embodiment)

Figure 4A:
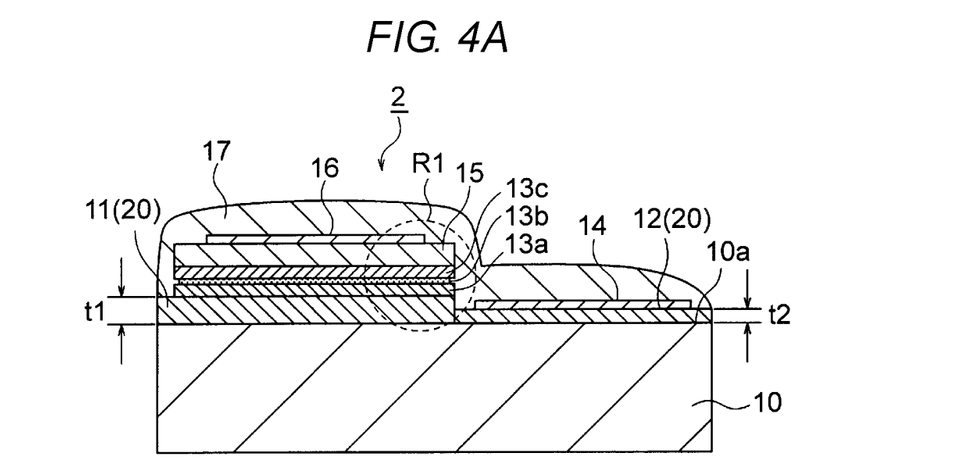
FIG. 4A is a cross-sectional view illustrating a schematic configuration of a light-emitting device according to a second embodiment.
Figure 4B:
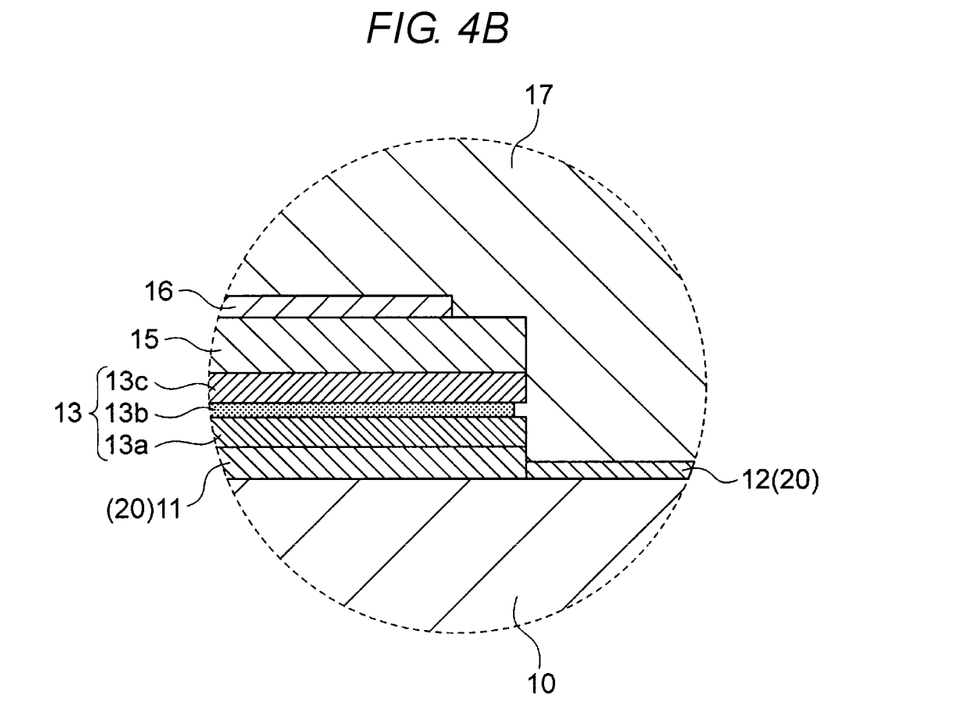
FIG. 4B is an enlarged view of a region R1 illustrated in FIG. 4A.

FIG. 4A is a cross-sectional view illustrating a schematic configuration of a light-emitting device according to a second embodiment, and FIG. 4B is an enlarged view of a region R1 illustrated in FIG. 4A. Hereinafter, the same components as those in the above-described first embodiment will be denoted by the same reference numerals and signs, and a detailed description thereof will be omitted here.

As illustrated in FIGS. 4A and 4B, a light-emitting device 2 according to the second embodiment is different from the light-emitting device 1 according to the first embodiment in that the outer peripheral surface of an active layer 13b is recessed inwardly with respect to the outer peripheral surface of a first clad layer 13a and the outer peripheral surface of a second clad layer 13c. Hereinafter, a process of forming a recess in the outer peripheral surface of the active layer 13b will be briefly described with reference to FIGS. 5 and 6.

Figure 5:
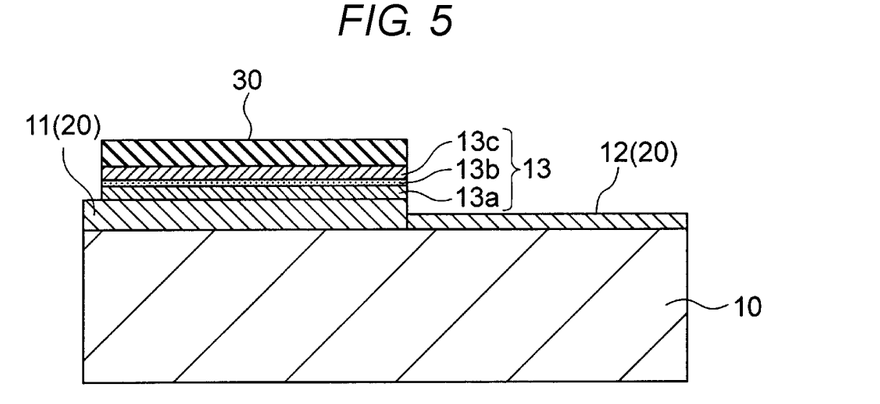
FIG. 5 is a cross-sectional view illustrating a state before a recess is formed in an outer peripheral surface of an active layer.
Figure 6:
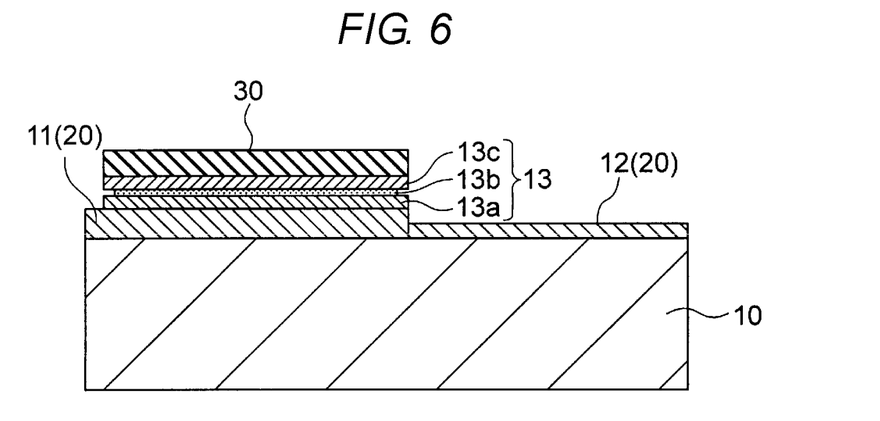
FIG. 6 is a cross-sectional view illustrating a state after the recess is formed in the outer peripheral surface of the active layer.

FIG. 5 is a cross-sectional view illustrating a state before a recess is formed in the outer peripheral surface of the active layer 13b. In addition, FIG. 6 is a cross-sectional view illustrating a state after the recess is formed in the outer peripheral surface of the active layer 13b. As illustrated in FIG. 5, the upper surface of the second clad layer 13c is covered with an undoped oxide (UDO) 30 formed of an oxide material with no impurities added thereto. In this state, reactive ion etching (RIE) is performed, and the UDO 30 is removed. At this time, an etching rate of the active layer 13b is different from etching rates of the first clad layer 13a and the second clad layer 13c. As a result, as illustrated in FIG. 6, a recess is formed in the outer peripheral surface of the active layer 13b. Thereafter, when the UDO 30 is removed and a portion of the conductive layer 20 and a portion of the light emitting layer 13 are removed in order to make a contact, it is also possible to adjust the amount of etching, an etch time, and the composition of respective materials (e.g., the clad material having a composition of Al that is greater than that of a contact layer material, or an active layer material is selected) so that a recess can be formed not only in the outer peripheral surface of the active layer 13b but also in the outer peripheral surface of the first clad layer 13a and the outer peripheral surface of the second clad layer 13c.

After a recess is formed in the outer peripheral surface of the active layer 13b, the first electrode 14 is formed on a second conductive portion 12. Thereafter, the second electrode 16 is formed on the upper surface of the second clad layer 13c from which the UDO 30 is removed.

According to the second embodiment, similarly as in the first embodiment, a thickness t2 of the second conductive portion 12 is smaller than a thickness t1 of a first conductive portion 11. For this reason, when light first reflected by the second surface 10b is further reflected by the first electrode 14, the amount of light absorbed is decreased. As a result, a difference between the amount of first light P and the amount of second light P2 is reduced, and thus it is possible to suppress the uneven distribution of the amount of light emitted from the substrate 10.

Further, in the second embodiment, the outer peripheral surface of the active layer 13b covered with a resin member 17 is recessed inwardly with respect to the outer peripheral surface of the first clad layer 13a and the outer peripheral surface of the second clad layer 13c. For this reason, adhesion between the resin member 17 and the light emitting layer 13 is enhanced by an anchor effect in which the resin member 17 enters the recess. Accordingly, it is possible to improve the reliability of the light-emitting device 2.

Modification Example 2

Figure 7A:
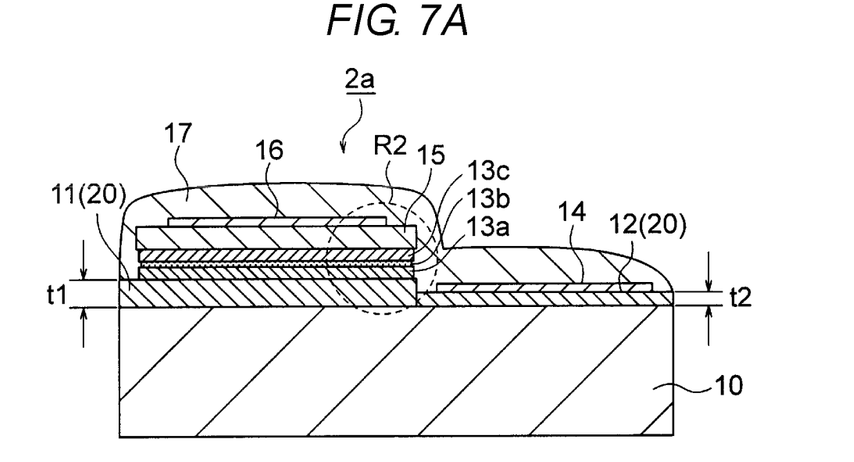
FIG. 7A is a cross-sectional view illustrating a schematic configuration of a light-emitting device according to a modification example of the second embodiment.

Hereinafter, a modification example of the second embodiment will be described with reference to FIG. 7. FIG. 7A is a cross-sectional view illustrating a schematic configuration of a light-emitting device according to a modification example of the second embodiment, and FIG. 7B is an enlarged view of a region R2 illustrated in FIG. 7A.

Figure 7B:
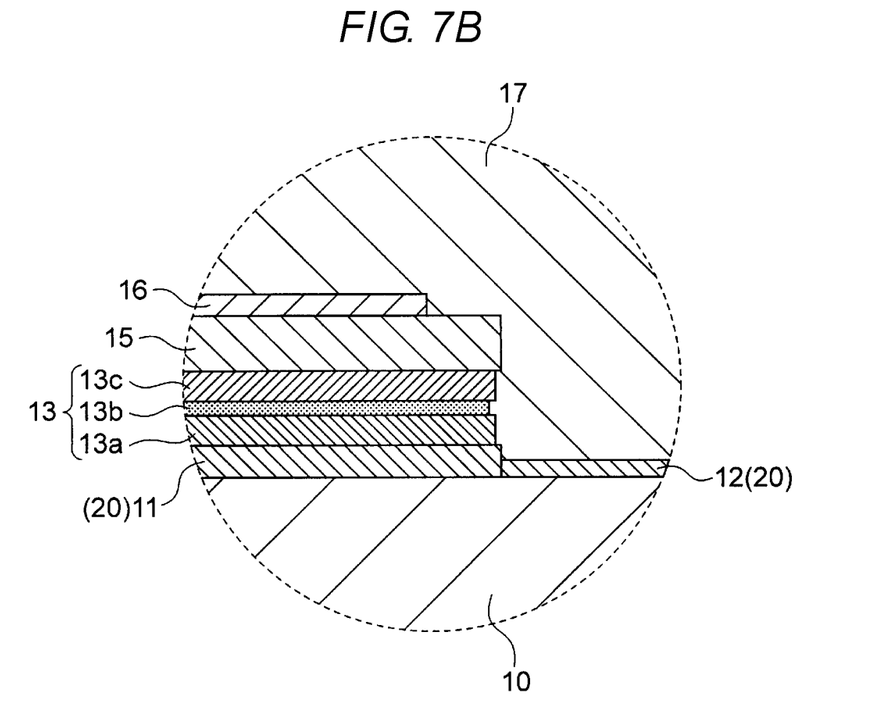
FIG. 7B is an enlarged view of a region R2 illustrated in FIG. 7A.

As illustrated in FIGS. 7A and 7B, in a light-emitting device 2a according to the present modification example, the outer peripheral surface of a first clad layer 13a is recessed inwardly with respect to the outer peripheral surface of a first conductive portion 11, and the outer peripheral surface of a second clad layer 13c is recessed inwardly with respect to the outer peripheral surface of a current diffusion layer 15. Hereinafter, a process of recessing the outer peripheral surface of the first clad layer 13a and the outer peripheral surface of the second clad layer 13c will be briefly described.

Also in the present modification example, similarly as with the unmodified second embodiment, RIE is performed in a state where the upper surface of the second clad layer 13c is covered with a UDO 30. Thereafter, when the UDO 30 is removed and a portion of a conductive layer 20 and a portion of a light emitting layer 13 are removed in order to make a contact, it is also possible to adjust the amount of etching, an etch time, and the respective material compositions so that a recess can be formed not only in the outer peripheral surface of the active layer 13b but also in the outer peripheral surface of the first clad layer 13a and the outer peripheral surface of the second clad layer 13c.

According to the present modification example, since the number of irregularities (surface roughness) increases in the outer peripheral surface of the light emitting layer 13, adhesion between the resin member 17 and the light emitting layer 13 is enhanced. Accordingly, it is possible to further improve the reliability of the light-emitting device 2.

In addition, as illustrated in FIGS. 4B and 7B, a recess is formed in the active layer 13b, the first clad layer 13a, and the second clad layer 13c so that the respective outer peripheral portions thereof are located further outside than the outer peripheral portion of the second electrode 16. In other words, when seen in the cross section illustrated in FIG. 4B or FIGS. 7A and 7B, the width of the light emitting layer 13 is wider than the width of the second electrode 16. Thereby, a process in which an electrode is formed using lift-off method is easier to perform, and a yield of devices is improved.

Modification Example 3

Figure 8:
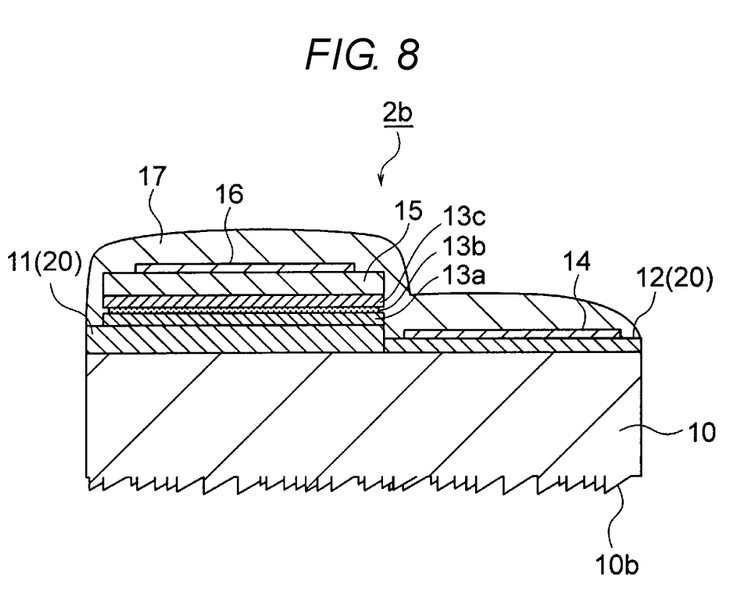
FIG. 8 is a cross-sectional view illustrating a schematic configuration of a light-emitting device according to another modification example of the second embodiment.

Hereinafter, another modification example of the second embodiment will be described with reference to FIG. 8. FIG. 8 is a cross-sectional view illustrating a schematic configuration of a light-emitting device according to another modification example of the second embodiment.

As illustrated in FIG. 8, in a light-emitting device 2b according to the present modification example, a second surface 10b of a substrate 10 has a textured structure after second surface 10b has been subjected to unevenness processing (e.g., surface roughening process), similar to the light-emitting device 1a illustrated in FIG. 3. Therefore, according to the present modification example, it is possible to diffuse light emitted from the second surface 10b over a wider range in addition to improving the reliability of the light-emitting device 2.

(Third Embodiment)

Figure 9A:
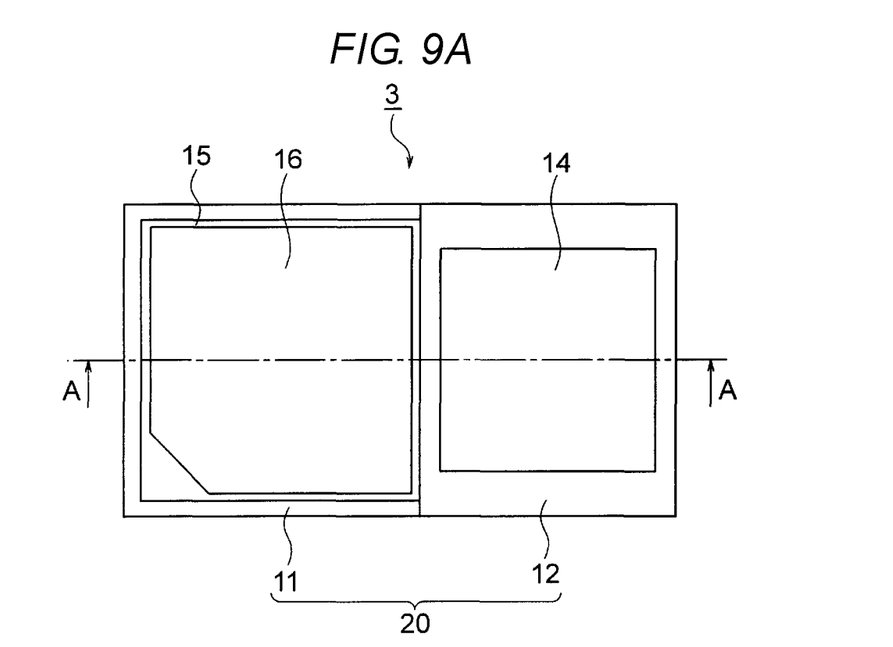
FIG. 9A is a plan view illustrating a schematic configuration of a light-emitting device according to a third embodiment.
Figure 9B:
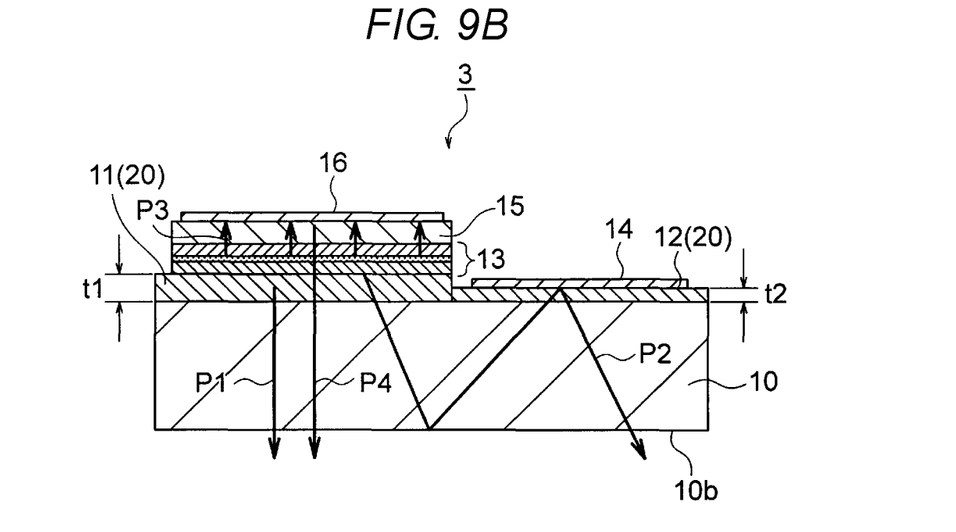
FIG. 9B is a cross-sectional view taken along line A-A illustrated in FIG. 9A.

FIG. 9A is a plan view illustrating a schematic configuration of a light-emitting device according to a third embodiment, and FIG. 9B is a cross-sectional view taken along line A-A illustrated in FIG. 9A. Hereinafter, the same components as those of the first embodiment will be denoted by the same reference numerals and signs, and a detailed description thereof will be omitted here.

As illustrated in FIG. 9A, a light-emitting device 3 according to the third embodiment is different from the light-emitting device 1 according to the first embodiment in that the planar area of a second electrode 16 is equal to the planar area of a light emitting layer 13.

As illustrated in FIG. 9B, light of the light emitting layer 13 includes not only light emitted to the lower side of the light emitting layer 13 (like first light P1 and second light P2), but also light emitted to the upper side of the light emitting layer 13 (like third light P3). For example, when the light-emitting device 3 is used in a photocoupler together with a light-receiving element, the light-receiving element is arranged to face a second surface 10b so as to receive the first light P1 (and the second light P2). For this reason, the third light P3, which is directed away from the light-receiving element, is not directly useable in the photocoupler. Consequently, in the third embodiment, the planar area of the second electrode 16 is made equal to the planar area of the light emitting layer 13, and thus major portion of the third light P3 is emitted from the second surface 10b as fourth light P4 after being reflected by the second electrode 16.

According to the third embodiment, in a similar manner to the first embodiment, a thickness t2 of a second conductive portion 12 is smaller than a thickness t1 of a first conductive portion 11. For this reason, when light reflected by the second surface 10b is further reflected by the first electrode 14, the amount of light absorbed is decreased. As a result, a difference between the amount of first light P1 and the amount of second light P2 is reduced, and thus it is possible to suppress the uneven distribution of the amount of light emitted from the substrate 10.

In particular, in the third embodiment, the planar area of the second electrode 16 is equal to the planar area of the light emitting layer 13. For this reason, it is possible to block the third light P3 which would otherwise be emitted away from the substrate 10 after being emitted from the upper side of the light emitting layer 13. The majority of the third light P3 is emitted from the second surface 10b as the fourth light P4 upon being reflected by the second electrode 16, and thus the amount of total light emitted from the second surface 10b is increased. Accordingly, the utilization efficiency of light is improved. Further, when the second electrode 16 is formed of a metal member, such as gold, which has high thermal conductivity, there is a tendency for the heat generated by the light emitting layer 13 to conducted into the second electrode and then be radiated or otherwise dispersed.

In the third embodiment, from the viewpoint of the blocking the third light P3, it is preferable that the planar area of the second electrode 16 is the same as the planar area of the light emitting layer 13, in other words, is 100% of the planar area of the light emitting layer 13. However, as the planar area of the second electrode 16 approximates 100% of the planar area of the light emitting layer 13, it might be assumed that the manufacturing yield of the second electrode 16 will be reduced. However, as the planar area of the second electrode 16 recedes from 100% of the planar area of the light emitting layer 13, it is assumed that a blocking effect is reduced. Therefore, it is typically preferable that the planar area of the second electrode 16 be in a range of from 80% to 90% of the planar area of the light emitting layer 13. It is even more preferable that the planar area of the second electrode 16 is approximately 85% of the planar area of the light emitting layer 13.

Modification Example 4

Figure 10:
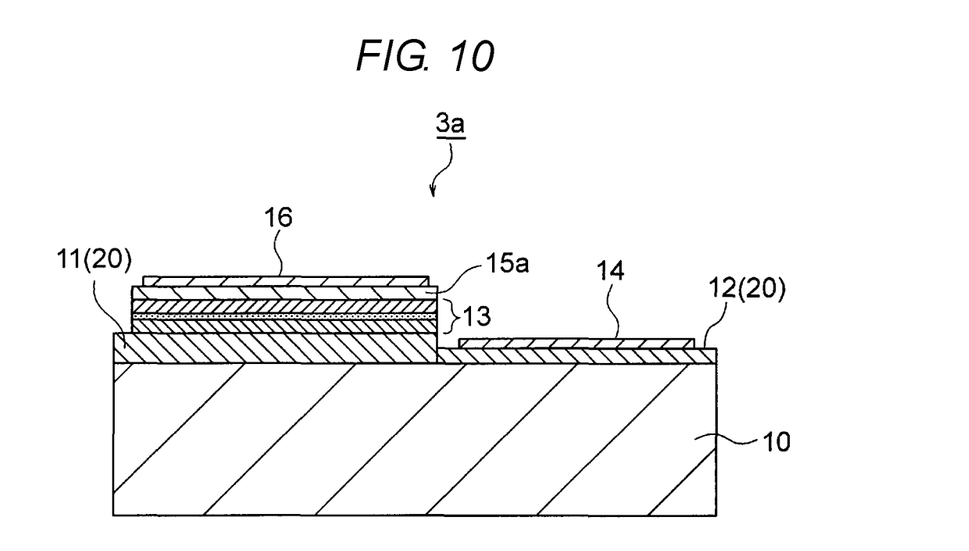
FIG. 10 is a cross-sectional view illustrating a schematic configuration of a light-emitting device according to a modification example of the third embodiment.

Hereinafter, a modification example of the third embodiment will be described with reference to FIG. 10. FIG. 10 is a cross-sectional view illustrating a schematic configuration of a light-emitting device according to a modification example of the third embodiment.

As illustrated in FIG. 10, a light-emitting device 3a according to the present modification example includes a current diffusion layer 15a instead of the current diffusion layer 15. Similarly to the current diffusion layer 15, the current diffusion layer 15a is formed of InAlGaP material or the like, and has a thickness less than the thickness of a conductive layer 11. In the present example, the thickness of the current diffusion layer 15a is approximately one fourth of the thickness of the conductive layer 11.

In the light-emitting device 3 according to the third embodiment, the planar area of a second electrode 16 is equal to the planar area of a light emitting layer 13. For this reason, the diffusion of current within the light emitting layer 13 is improved, and thus the necessity of a thick current diffusion layer 15 is decreased.

Consequently, in the present modification example, the current diffusion layer 15a, which is thinner than the current diffusion layer 15, is used. Thereby, it is possible to make the device thinner in addition to improving optical characteristics and heat radiation characteristics.

Modification Example 5

Figure 11:
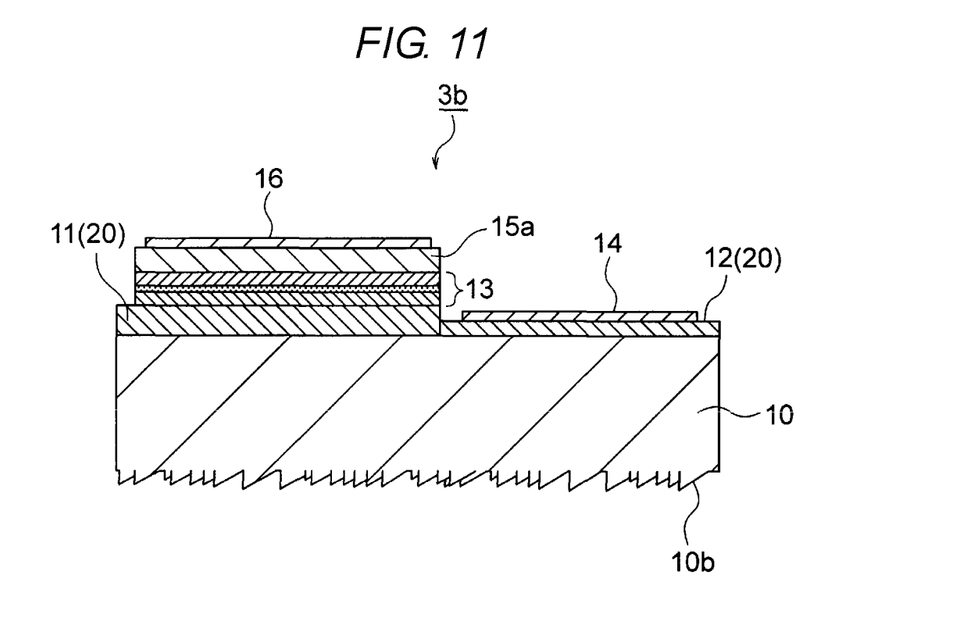
FIG. 11 is a cross-sectional view illustrating a schematic configuration of a light-emitting device according to another modification example of the third embodiment.

Hereinafter, another modification example of the third embodiment will be described with reference to FIG. 11. FIG. 11 is a cross-sectional view illustrating a schematic configuration of a light-emitting device according to another modification example of the third embodiment.

As illustrated in FIG. 11, in a light-emitting device 3b according to the present modification example, similar to the light-emitting device 1a illustrated in FIG. 3, a second surface 10b of a substrate 10 has a textured structure after being subjected to unevenness processing. Therefore, according to the present modification example, it is possible to diffuse light emitted from the second surface 10b over a wider range in addition to improving optical characteristics and heat radiation characteristics.

Modification Example 6

Figure 12:
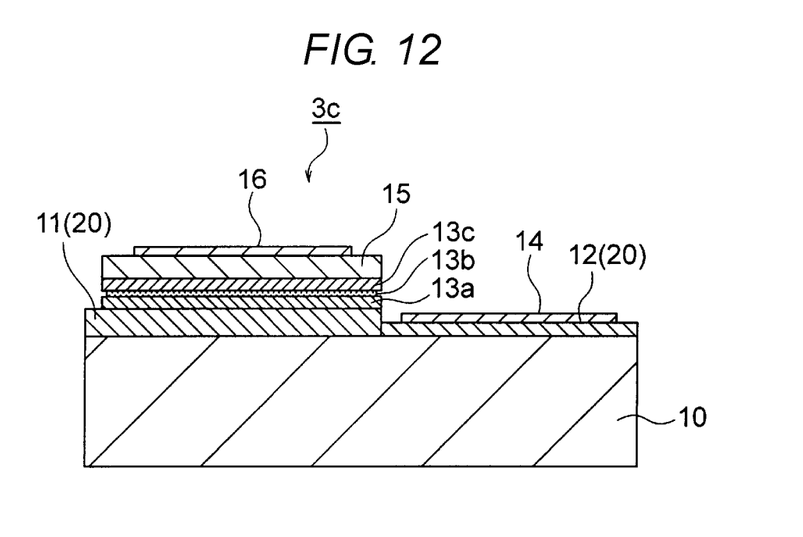
FIG. 12 is a cross-sectional view illustrating a schematic configuration of a light-emitting device according to still another modification example of the third embodiment.

Hereinafter, still another modification example of the third embodiment will be described with reference to FIG. 12. FIG. 12 is a cross-sectional view illustrating a schematic configuration of a light-emitting device according to still another modification example of the third embodiment.

As illustrated in FIG. 12, in a light-emitting device 3c according to the present modification example, similar to the light-emitting device 2 illustrated in FIG. 4, the outer peripheral surface of an active layer 13b is recessed inwardly with respect to the outer peripheral surface of a first clad layer 13a and the outer peripheral surface of a second clad layer 13c. Thereby, adhesion between a resin member 17 and a light emitting layer 13 is enhanced. As described above, the recess is formed by adjusting the amount of etching, an etch time, and/or the respective material compositions (for example, an active layer having a composition of Al larger than that of a contact layer is selected).

Therefore, according to the present modification example, it is possible to improve the reliability of the light-emitting device 2 in addition to improving optical characteristics and heat radiation characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device, comprising:
a transparent substrate having a first surface;
a conductive layer including a first conductive portion on the first surface and a second conductive portion on the first surface, the second conductive portion being adjacent to the first conductive portion in a first direction along the first surface, the second conductive portion having a thickness in a second direction from the first surface that is less than a thickness in the second direction from the first surface of the first conductive portion;
a light emitting layer on the first conductive portion, the light emitting layer including a first clad layer on the first conductive portion, an active layer on the first clad layer, and a second clad layer on the active layer;
a first electrode on the second conductive portion; and
a second electrode on the light emitting layer, wherein
an outer peripheral surface of the first clad layer and an outer peripheral surface of the second clad layer are each disposed beyond an outer peripheral surface of the active layer in the first direction.

2. The light-emitting device according to claim 1, further comprising:
a current diffusion layer between the second clad layer and the second electrode, wherein
the outer peripheral surface of the first clad layer is not aligned with an outer peripheral surface of the first conductive portion in the second direction, the outer peripheral surface of the first conductive portion extending outwardly beyond the outer peripheral surface of the first clad layer, and
the outer peripheral surface of the second clad layer is not aligned with an outer peripheral surface of the current diffusion layer, the outer peripheral surface of the current diffusion layer extending outwardly beyond the outer peripheral surface of the second clad layer.

3. The light-emitting device according to claim 2, wherein
the first surface is directly contacting the first conductive portion and the second conductive portion, and
a second surface of the transparent substrate on an opposite side of the transparent substrate from the first surface is irregular.

4. The light-emitting device according to claim 3, wherein surface roughness of a first region of the second surface is greater than surface roughness of a second region of the second surface, the first region corresponding in position along the first direction with the first conductive portion, and the second region corresponding in position along the first direction with the second conductive portion.

5. The light-emitting device according to claim 1, wherein a total planar area of the second electrode is 80 to 90% of a total planar area of the active layer.

6. The light-emitting device according to claim 1, wherein
the first surface is directly contacting the first conductive portion and the second conductive portion, and
a second surface of the transparent substrate on an opposite side of the transparent substrate from the first surface is irregular.

7. The light-emitting device according to claim 1, wherein a total planar area of the second electrode is 80 to 90% of a total planar area of the light emitting layer.

8. The light-emitting device according to claim 1, wherein the first and second conductive portions are of a same material.

9. A light-emitting device, comprising:
a first conductive portion on a first surface of a transparent substrate and having a first total thickness along a first direction;
a second conductive portion on the first surface adjacent to the first conductive portion in a second direction crossing the first direction and having a second total thickness along the first direction that is less than the first total thickness;
a first electrode on the second conductive portion, the second conductive portion being between the first electrode and the transparent substrate in the first direction;
a light-emitting layer on the first conductive portion, the first conductive portion being between the light-emitting layer and the transparent substrate in the first direction; and
a second electrode on the light-emitting layer, the light-emitting layer between the second electrode and the first conductive portion in the first direction, wherein
the light-emitting layer comprises an active layer between a first clad layer and a second clad layer, and
an outer peripheral surface of the active layer is inwardly recessed in the second direction from an outer peripheral surface of the first clad layer and an outer peripheral surface of the second clad layer.

10. The light-emitting device according to claim 9, further comprising a current diffusion layer on the light-emitting layer between the second electrode and the light emitting layer in the first direction.

11. The light-emitting device according to claim 9, further comprising a resin material provided on the first surface to cover the first electrode, the second electrode, the light-emitting layer, the first conductive portion, and the second conductive portion, wherein the resin material fills a recess formed in an outer peripheral surface of the light emitting layer.

12. The light-emitting device according to claim 9, wherein a total planar area of the second electrode is 80 to 90% of a total planar area of the light-emitting layer.

13. The light-emitting device according to claim 9, wherein a second surface of the transparent substrate opposite the first surface is roughened so as to reduce internal reflections.

14. The light-emitting device according to claim 13, wherein a first region of the second surface has a different surface roughness from a second region of the second surface the first region corresponding in position along the second direction with the first conductive portion, and the second region corresponding in position along the second direction with the second conductive portion.

15. A light-emitting device, comprising:
a first conductive portion on a first surface of a transparent substrate and having a first total thickness along a first direction, the transparent substrate being substantially transparent to light of a first wavelength;
a second conductive portion on the first surface adjacent to the first conductive portion in a second direction crossing the first direction and having a second total thickness along the first direction that is less than the first total thickness, the second conductive portion being substantially transparent to light at the first wavelength;
a first electrode on the second conductive portion, the second conductive portion between the first electrode and the transparent substrate in first direction;
a light-emitting layer on the first conductive portion, the first conductive portion being between the light-emitting layer and the transparent substrate in the first direction, the light-emitting layer emitting light at the first wavelength;
a second electrode on the light-emitting layer, the light-emitting layer being between the second electrode and the first conductive portion in the first direction, the second electrode comprising a metal; and
a resin material covering exposed upper surfaces of the first conductive portion, the second conductive portion, the first electrode, the second electrode, and the light-emitting layer, wherein
the light emitting layer includes a first clad layer on the first conductive portion, an active layer on the first clad layer, and a second clad layer on the active layer, and
an outer peripheral surface of the first clad layer and an outer peripheral surface of the second clad layer are each disposed beyond an outer peripheral surface of the active layer in the second direction.

16. The light-emitting device according to claim 1, wherein the outer peripheral surface of the first clad layer and the outer peripheral surface of the second clad layer are aligned with each other along the second direction.

17. The light-emitting device according to claim 1, wherein the light emitting layer has an outer peripheral surface that is convex shaped.

18. The light-emitting device according to claim 9, wherein the outer peripheral surface of the first clad layer and the outer peripheral surface of the second clad layer are aligned with each other along the first direction.

* * * * *